(12) United States Patent
Powers

(10) Patent No.: US 6,883,978 B2
(45) Date of Patent: Apr. 26, 2005

(54) LOW COST PACKAGE DESIGN FOR FIBER COUPLED OPTICAL COMPONENT

(75) Inventor: Michael Powers, Amherst, NH (US)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/606,606

(22) Filed: Jun. 26, 2003

(65) Prior Publication Data

US 2004/0264886 A1 Dec. 30, 2004

(51) Int. Cl.[7] .............................. G02B 6/42; G02B 6/36; G02B 6/30; G02B 6/26
(52) U.S. Cl. ................ 385/92; 385/80; 385/91; 385/93; 385/14; 385/63; 385/88; 385/89; 385/137; 385/69; 385/73; 385/77; 385/53; 385/58; 385/70; 385/74; 385/78; 385/54; 385/59; 385/71; 385/75; 385/79; 385/55; 385/60; 385/72; 385/76; 385/52; 385/56; 250/216; 250/227.11; 250/227.28
(58) Field of Search ................ 385/14, 52–56, 385/58–60, 63–66, 69–79, 80, 88–94, 137, 136, 49, 32; 250/216, 227.11, 227.28

(56) References Cited

U.S. PATENT DOCUMENTS

| | | | |
|---|---|---|---|
| 4,008,948 A | | 2/1977 | Dalgleish et al. |
| 4,174,491 A | | 11/1979 | Nakamura et al. |
| 4,237,474 A | * | 12/1980 | Ladany ..................... 385/49 |
| 4,500,165 A | * | 2/1985 | Scholl et al. ............... 385/90 |
| 4,663,652 A | | 5/1987 | Nishizawa |
| 4,702,547 A | | 10/1987 | Enochs |
| 4,741,796 A | | 5/1988 | Althaus et al. |
| 4,779,788 A | | 10/1988 | Rossberg |
| 4,798,439 A | | 1/1989 | Preston |
| 4,818,056 A | * | 4/1989 | Enochs et al. ............. 385/88 |
| 5,077,878 A | | 1/1992 | Armiento et al. |
| 5,163,108 A | | 11/1992 | Armiento et al. |
| 5,227,646 A | * | 7/1993 | Shigeno ..................... 257/80 |
| 5,228,101 A | * | 7/1993 | Lebby et al. ............... 385/91 |
| 5,345,529 A | * | 9/1994 | Sizer et al. ................ 385/147 |
| 5,412,748 A | | 5/1995 | Furuyama et al. |
| 5,535,296 A | * | 7/1996 | Uchida ...................... 385/89 |
| 5,559,918 A | | 9/1996 | Furuyama et al. |
| 5,602,955 A | | 2/1997 | Haake |
| 5,619,609 A | * | 4/1997 | Pan et al. ................. 385/136 |
| 5,745,624 A | | 4/1998 | Chan et al. |
| 5,768,456 A | * | 6/1998 | Knapp et al. .............. 385/49 |
| 5,881,198 A | | 3/1999 | Haake |
| 5,896,481 A | | 4/1999 | Beranek et al. |
| 6,146,025 A | | 11/2000 | Abbink et al. |
| 6,164,837 A | | 12/2000 | Haake et al. |
| 6,207,950 B1 | * | 3/2001 | Verdiell .................... 250/239 |
| 6,216,939 B1 | | 4/2001 | Thackara |
| 6,282,350 B1 | * | 8/2001 | Takahashi et al. ......... 385/88 |
| 6,415,167 B1 | * | 7/2002 | Blank et al. .............. 600/344 |
| 6,477,284 B1 | * | 11/2002 | Oda et al. ................. 385/14 |
| 6,623,180 B1 | * | 9/2003 | Panicker et al. ........... 385/92 |
| 6,652,158 B1 | * | 11/2003 | Bartur et al. .............. 385/92 |
| 6,712,528 B1 | * | 3/2004 | Galeotti et al. ............ 385/91 |
| 2001/0010742 A1 | * | 8/2001 | Nakagawa et al. ......... 385/84 |
| 2002/0110328 A1 | * | 8/2002 | Bischel et al. ............. 385/49 |
| 2003/0053765 A1 | * | 3/2003 | Oda et al. ................. 385/88 |
| 2003/0210866 A1 | * | 11/2003 | Kuhara et al. ............. 385/49 |
| 2003/0223709 A1 | * | 12/2003 | Lake et al. ................ 385/94 |

* cited by examiner

Primary Examiner—John R. Lee
Assistant Examiner—Bernard E. Souw
(74) Attorney, Agent, or Firm—RatnerPrestia

(57) ABSTRACT

A fiber-coupled optical component package comprises a high thermal conductivity base, a housing including a ceramic substrate, an optical component mount aperture formed on the substrate and a substantially planar fiber mount region on the substrate adjacent to the optical component mount aperture. An optical component may be secured within an area defined by the optical component mount aperture and an optical fiber may be secured to the substantially planar fiber mount region to optically couple the fiber and the optical component. A package lid may be placed over one or more of the housing, the optical component, and a portion of the fiber.

25 Claims, 15 Drawing Sheets

LOW COST PACKAGE DESIGN FOR FIBER COUPLED OPTICAL COMPONENT

TECHNICAL FIELD

The present invention relates generally to fiber-coupled optical components and, more particularly, to packages for fiber-coupled optical components that are made with vertical assembly steps.

BACKGROUND OF THE INVENTION

The importance of achieving accurate mutual alignment of individual components in any optical system is well known. The miniature dimensions of components used in modern optical communication systems render such alignment difficult both to achieve and to maintain. For example, one problem in the construction of laser transmitters is that of efficiently coupling the optical output signal from a laser diode into an optical fiber. To obtain efficient coupling, the laser is desirably precisely aligned with the acceptance area of the optical fiber. When such alignment is achieved, the laser is then fixed in place, ideally by a method that ensures alignment is sustained throughout the device lifetime.

Typically, fiber-coupled diode lasers are packaged in gold plated metal packages and the fiber is held in alignment with the laser using either epoxy, laser weld, or solder attachment techniques. Epoxy attachment is low cost but is not reliable over a long period of time due to outgassing and alignment shifts arising from aging and temperature cycling. Laser weld techniques are reliable but require costly ferrulization of the fiber and specially designed mounts or clips to allow weld attachment of the ferrulized fiber. Solder attachment techniques, on the other hand, are reliable and low cost, and have become prevalent in the art.

The mounting point at which the fiber is soldered desirably has specific material properties in order to work effectively. An acceptable material for the mounting point desirably has a low thermal conductivity (e.g. less than 50 W/m-K) and a thermal expansion coefficient that maintains fiber alignment while the package is heated. The exact thermal expansion property desired may depend on the material to which the laser is mounted, the respective thickness of the fiber mount and laser submount, and/or the temperature profiles expected during operation. The fiber mount material also may be soldered or be able to be plated with a solderable material. During the soldering process, the fiber mount may experience significant stress resulting from differential expansion due to temperature gradients and materials differences. Therefore, the fiber mount desirably has a high tensile strength (e.g. greater than 25 kpsi) to avoid fracturing.

Currently, fiber-coupled laser packages include separate mount components for the fiber and the laser and primarily have a snout feedthrough for the fiber to enter the package body. This feedthrough requires the fiber to be threaded through at some point in the assembly process, which may cause manufacturing complications, as feeding a fiber through a side tube on a package may be difficult to implement with standard automated manufacturing equipment. Since the associated feedthrough step includes horizontal threading of the optical fiber, it is difficult to automate and causes yield issues associated with fiber damage.

During manufacture of fiber-coupled laser packages, it is also desirable to monitor the alignment of the optical fiber with the laser using cameras and machine vision. Desirable views may include an overhead view of the process as well as side views of the process. In many of the currently used packages, however, it is difficult to obtain a side view of the fiber-laser alignment area, which presents complications to automation monitoring.

SUMMARY OF THE INVENTION

The present invention is embodied in a fiber-coupled optical component housing comprising a substrate having an optical component mount aperture formed therein and a substantially planar fiber mount region adjacent to the optical component mount aperture.

The fiber-coupled optical component housing may further include one or more electrical contacts formed on the housing and means for mounting a lid on the housing. The housing may be mounted on a high thermal conductivity base, and may further include an optical component secured to the base within an area defined by the optical component mount aperture and an optical fiber secured on the substantially planar fiber mount region to optically couple the fiber and the optical component.

The fiber-coupled optical component housing may further include a metallic fiber mount pad formed on the substantially planar fiber mount region.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1A:
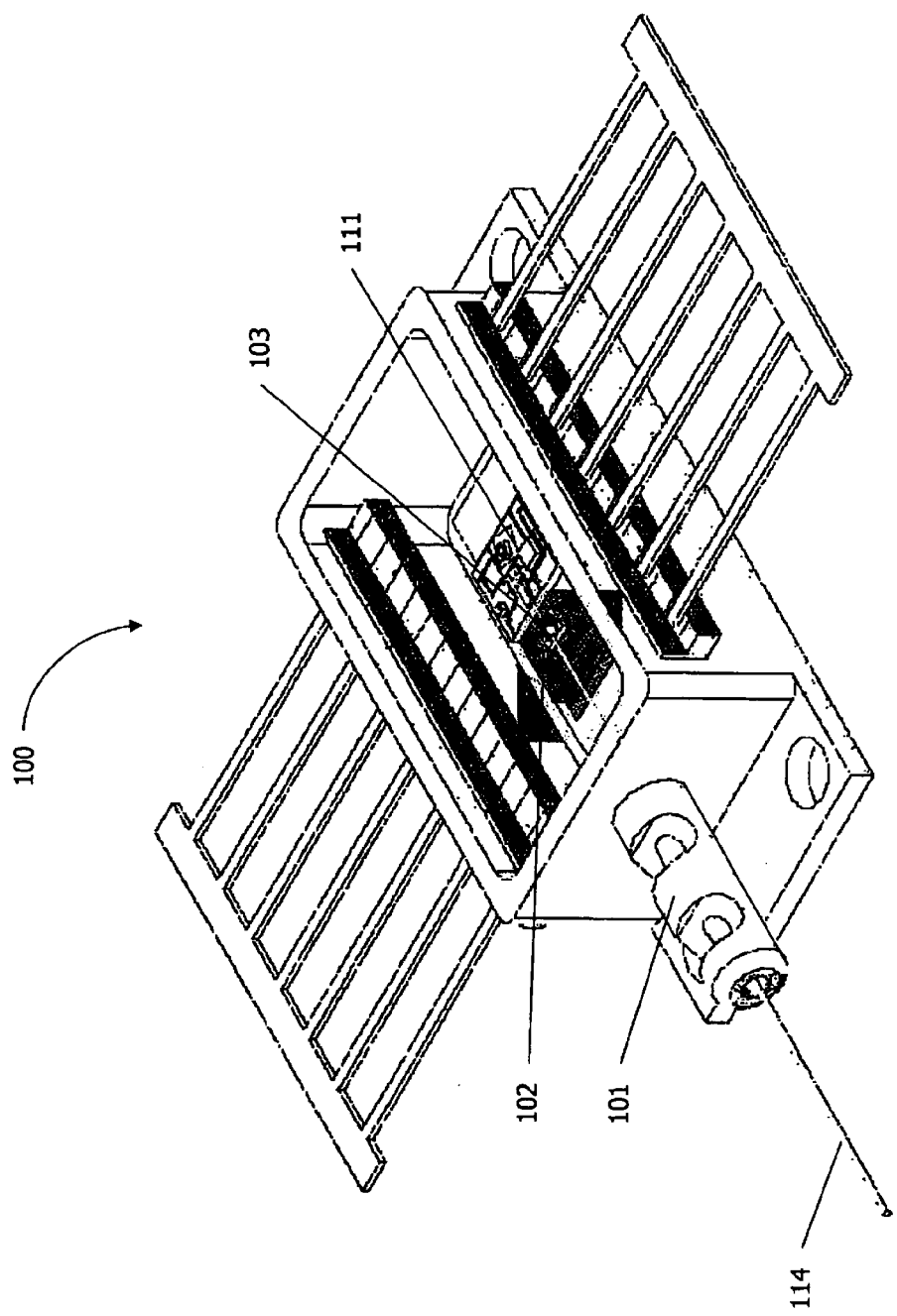
FIG. 1A is a perspective view of a fiber-coupled optical component package showing the snout feedthrough for an optical fiber and the optical fiber soldered to a separate mount component within the package, according to the prior art.
Figure 1B:
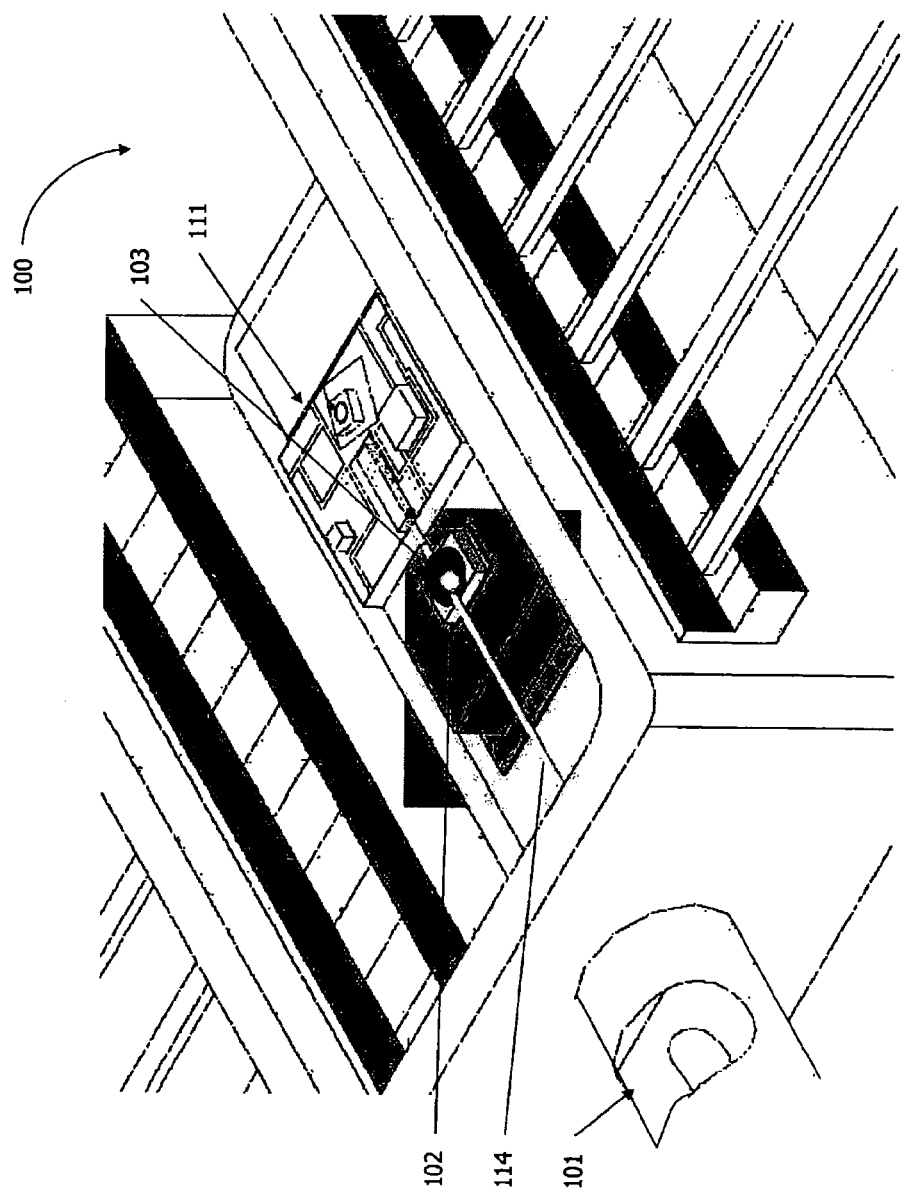
FIG. 1B is an enlarged view of a portion of the package shown in FIG. 1A, according to the prior art.

Referring now to the drawing, in which like reference numbers refer to like elements throughout the various figures that comprise the drawing, FIG. 1A shows a package 100 according to the prior art and FIG. 1B is a close up of a portion of package 100.

The prior art package 100 includes optical fiber 114 inserted through snout feedthrough 101 and attached to fiber mount 102 with solder 103. Optical fiber 114 is also optically coupled to optical component 111 (e.g. semiconductor laser). It can be seen that optical fiber 114 is mounted on a separate fiber mount 102 than optical component 111 and that there may be the lack of an available side view on the area where fiber 114 is to be aligned and coupled to optical component 111. Further, the insertion of fiber 114 through snout feedthrough 101 may require a non-vertical manufacturing process, which may cause complications in the manufacturing process resulting in yield issues.

Figure 2:
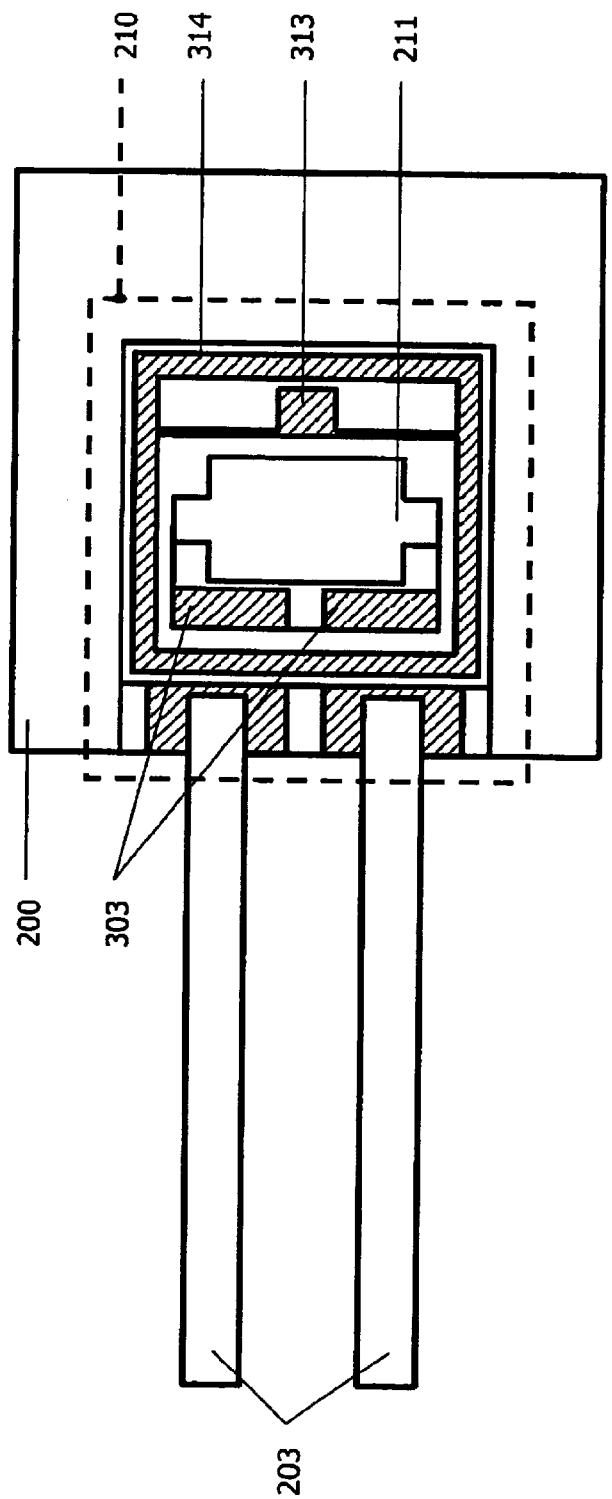
FIG. 2 is an overhead plan drawing of the housing mounted on the base with leads attached, according to the present invention.

FIG. 2 shows an exemplary embodiment of the present invention as a basic package with high thermal conductivity (e.g. 130 W/m-K) base 200 with fiber-coupled optical component housing 210 mounted on base 200. Housing 210 defines an optical component mount 211 to which an optical component such as a laser within a standard submount package or an unpackaged PIN diode laser (not shown in FIG. 2) may be coupled. Housing 210 may further include fiber-mountable pad 313 to which an optical fiber (not shown in FIG. 2) may be coupled, and electrical contacts 303 to which electric leads 203 may be coupled to provide operational power to the package. Housing 210 may further include a seal ring 314 to which a package lid (not shown in FIG. 2) may be coupled.

Figure 3A:
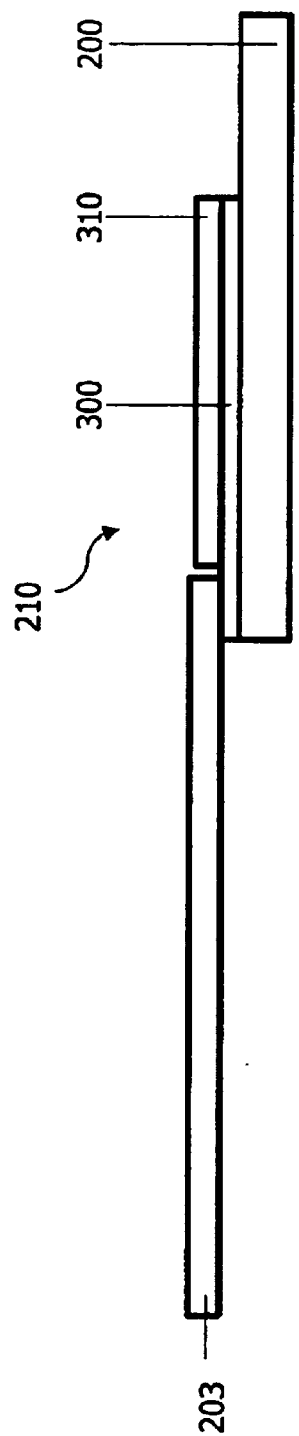
FIG. 3A is a side plan drawing of the housing mounted on the base with leads attached, according to the present invention.

FIG. 3A shows a side plan drawing of an exemplary embodiment of the present invention, and shows housing 210 as comprising housing bottom layer 300 and housing top layer 310 with electrical leads 203 coupled to housing bottom layer 300.

Figure 3B:
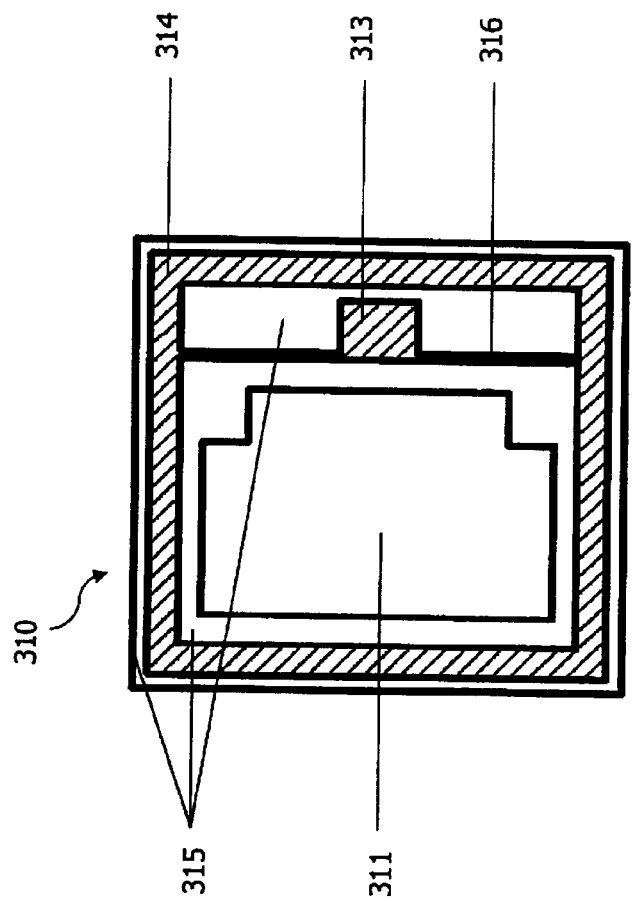
FIG. 3B is an overhead plan drawing of the top layer of the optical component housing, according to the present invention.

FIG. 3B shows an exemplary embodiment of top layer 310, which may have a thermal conductivity less than that of base 200 (e.g. 20 W/m-K). Top layer 310 includes a top layer substrate 315 upon which seal ring 314, fiber-mountable pad 313, and top layer aperture 311 may be formed.

In one embodiment of the invention, seal ring 314 and fiber-mountable pad 313 may be formed from a refractory material (e.g. tungsten) to be plated with nickel and then gold, wherein an optional thin strip of metallization 316 may be desirably formed to electrically couple seal ring 314 and fiber-mountable pad 313 so that they may all be electroplated in a single step.

Figure 3C:
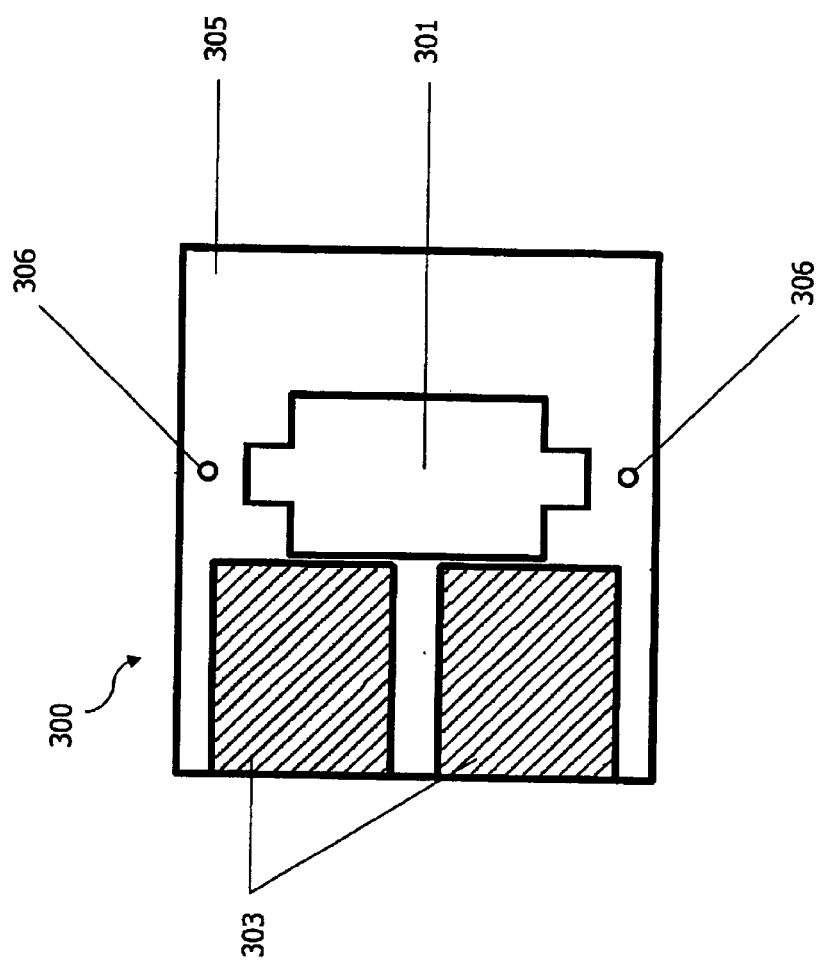
FIG. 3C is an overhead plan drawing of the bottom layer of the optical component housing, according to the present invention.

FIG. 3C shows an exemplary embodiment of bottom layer 300, which may also have a thermal conductivity less than that of base 200 (e.g. 20 W/m-K). Bottom layer 300 includes a bottom layer substrate 305 upon which electrical contacts 303 and bottom layer aperture 301 may be formed. Electrical contacts 303 may be desirably formed from a refractory material (e.g. tungsten) to be plated with nickel and then gold.

In one embodiment of the invention, one or more base-connecting vias 306 may be formed to couple one or more of seal ring 314, fiber-mountable pad 313, and metallization 316 on top layer 310 to base 200 so the entire package may be electroplated with minimal connections (e.g. one connection to base 200 and another to electrical leads 203). Base-connecting vias 306 may also provide a negligible thermal path to base 200 to dissipate heat during device operation. In the exemplary embodiment illustrated by FIG. 3C, bottom layer 300 is shown to contain two base-connecting vias 306. It is understood, however, that other embodiments of the present invention may contain any number of vias as desired.

In an exemplary embodiment, the high thermal conductivity base 200 may be desirably formed from copper-tungsten (Cu—W) and substrates 305 and 315 from aluminum oxide (alumina), due to the desirable thermal expansion coefficient (TEC) compatibility of these materials. Further, electrical leads 203 may be formed from a nickel-cobalt-iron alloy (e.g. Kovar, ASTM alloy F15).

Additionally, housing top layer 310 and housing bottom layer 300 may be desirably coupled to form housing 210 through a high temperature cofired ceramic (HTCC) process; and housing 210 and base 200 may be desirably coupled by brazing with a silver-copper braze. Electrical leads 203 may also be desirably coupled to electrical contacts 303 by brazing with a silver-copper braze. Further, the combination of top layer aperture 311 and bottom layer aperture 301 defines optical component mount 211.

Figure 4:
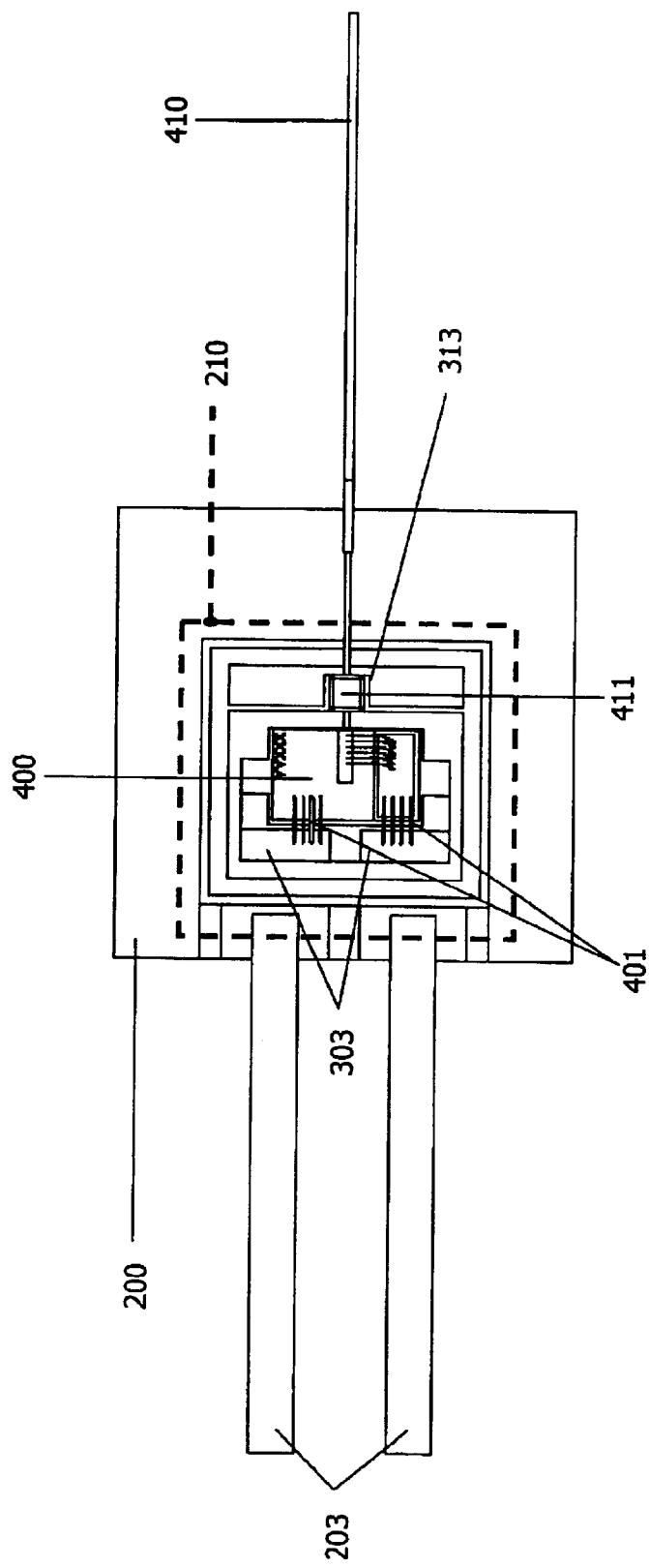
FIG. 4 is an overhead plan drawing of the housing mounted on the base with leads attached and an optical component in place and wirebonded to electrical contacts, according to the present invention.

FIG. 4 shows an exemplary package in which optical component 400 (e.g. semiconductor laser) and optical fiber 410 have been installed. Optical component 400 is mounted on the base 200 through the optical component mount 211 and is further electrically coupled to the corresponding electrical contacts 303 with wirebonds 401. Additionally, optical component 400 may be coupled to the base 200 within the area defined by optical component mountable aperture 211 with submount preform 501 (not shown in FIG. 4), which may be formed from an indium alloy solder (e.g. InPb). Further, an optical fiber 410 is aligned such that it is optically coupled to optical component 400 and is then secured to fiber mountable pad 313 with fiber solder preform 411.

In an exemplary embodiment, wirebonds 401 may be formed from gold and optical fiber 410 may be desirably metallized with gold-nickel-gold so as to be compatible with a fiber solder preform 411 formed from gold-tin solder. In an alternate embodiment, optical fiber 410 may be non-metallized and fiber solder preform 411 may then be formed from glass solder. In such an alternate embodiment, there may not be the need for a fiber mountable pad 313 and optical fiber 410 may be secured directly to housing 210 with fiber solder preform 411 formed from glass solder.

Further, optical fiber 410 may be desirably optically coupled to optical component 400 by an alignment process which includes: 1) rough placement using optical vision cameras utilizing top and side camera views; 2) activation of the optical component, and 3) precise movement of the fiber in 3 axes so that the output signal from the optical component at the fiber output interface is a desired value. Typically, there is a 5–10 micron separation between optical fiber 410 and optical component 400.

Figure 5:
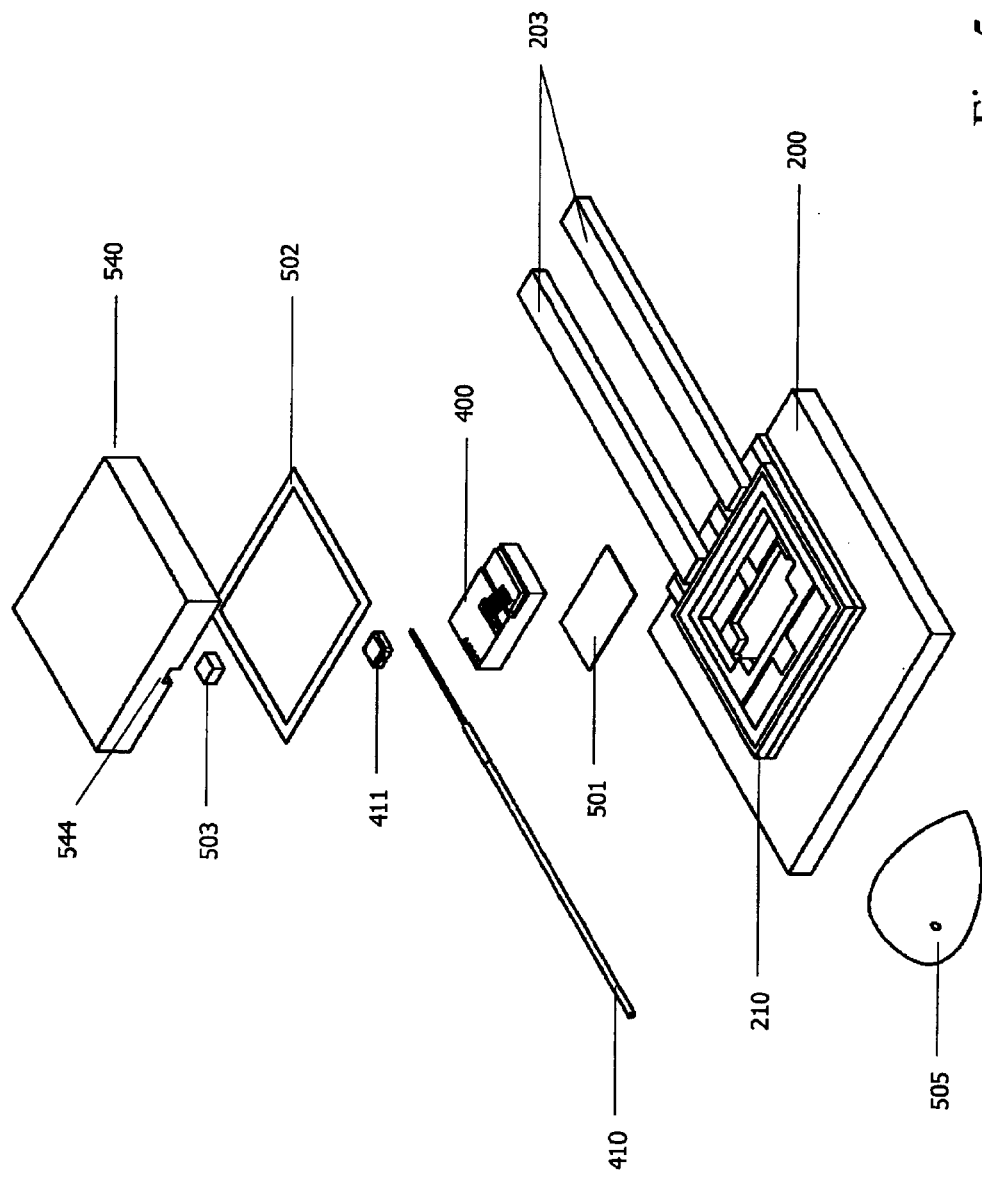
FIG. 5 is an exploded perspective drawing of a package, according to the present invention.

FIG. 5 shows an exploded perspective view of the basic package along with further components of an exemplary embodiment separately. An exemplary method of manufacturing a fiber-coupled optical component package may include coupling housing 210 to base 200, coupling electrical leads 203 to housing 210, coupling optical component 400 to housing 210 with submount preform 501, coupling optical fiber 410 to housing 210 with optical fiber preform 411, further coupling optical fiber 410 to housing 210 and package lid 540 at fiber opening 544 with fiber seal 503, and coupling package lid to housing 210 with lid seal preform 502. The method may also desirably include applying optical sealant 505 to fill gaps between optical fiber 410, housing 210, base 200, and package lid 540.

In an exemplary embodiment, package lid 540 may be formed from Kovar and fiber seal 503 and lid seal preform 502 may be formed from an indium alloy solder having a melting point lower than that of the submount preform 501 (e.g. InSn). In an alternate embodiment, fiber seal 503 and lid seal preform 502 may be formed from epoxy. Additionally, optical sealant 505 may be formed epoxy, silicone, or solder.

Figure 6:
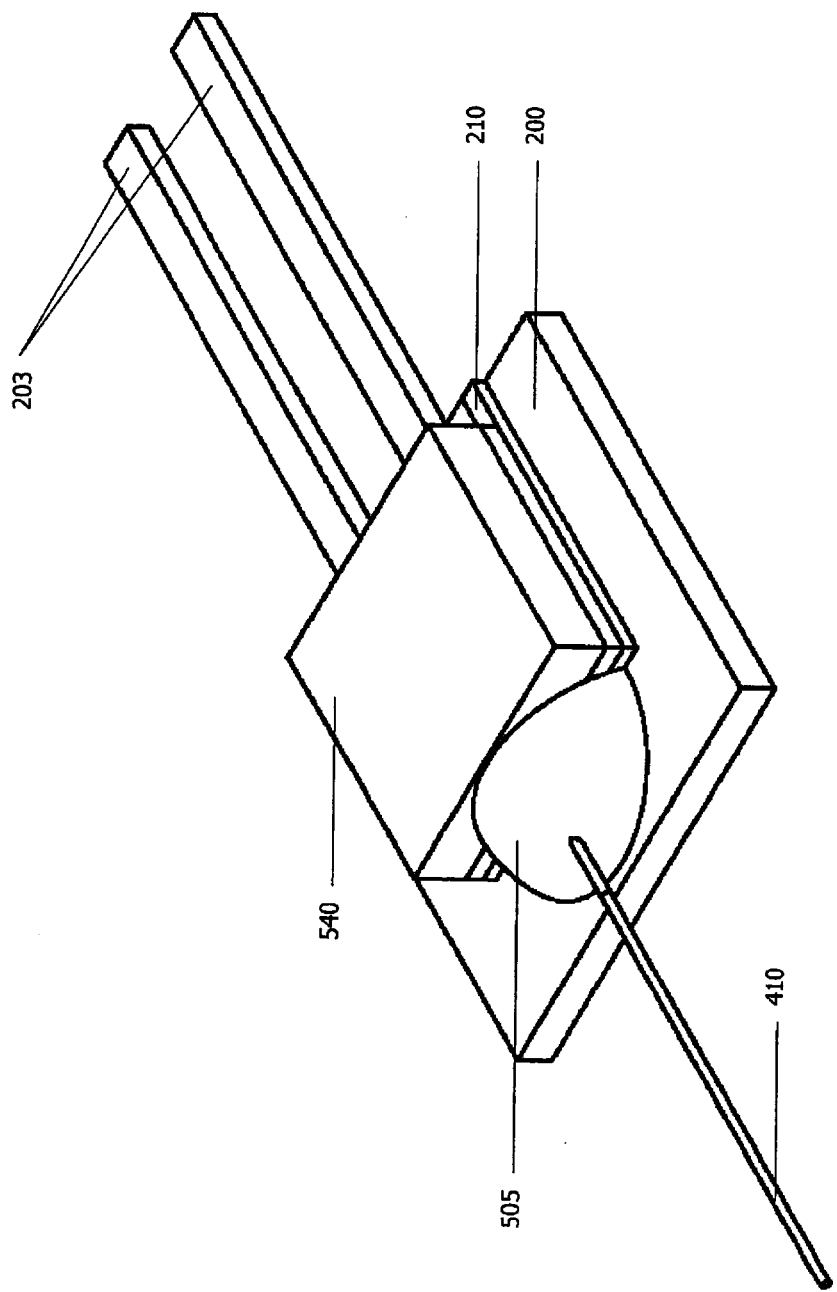
FIG. 6 is a perspective plan drawing of a package with attached components, package lid in place and with fiber sealant in place, according to the present invention.

FIG. 6 shows an assembled package with base 200, housing 210 mounted on base 200, leads 203 coupled to housing 210, fiber 410 coupled to housing 210, package lid 540 mounted on housing 210, and optical sealant 505 applied on fiber 410 at fiber opening 544 (not shown in FIG. 6) over a portion of base 200. Optical sealant 505 is desirably applied so that it fills gaps between fiber 410, base 200, housing 210, and lid 540.

Figure 7:
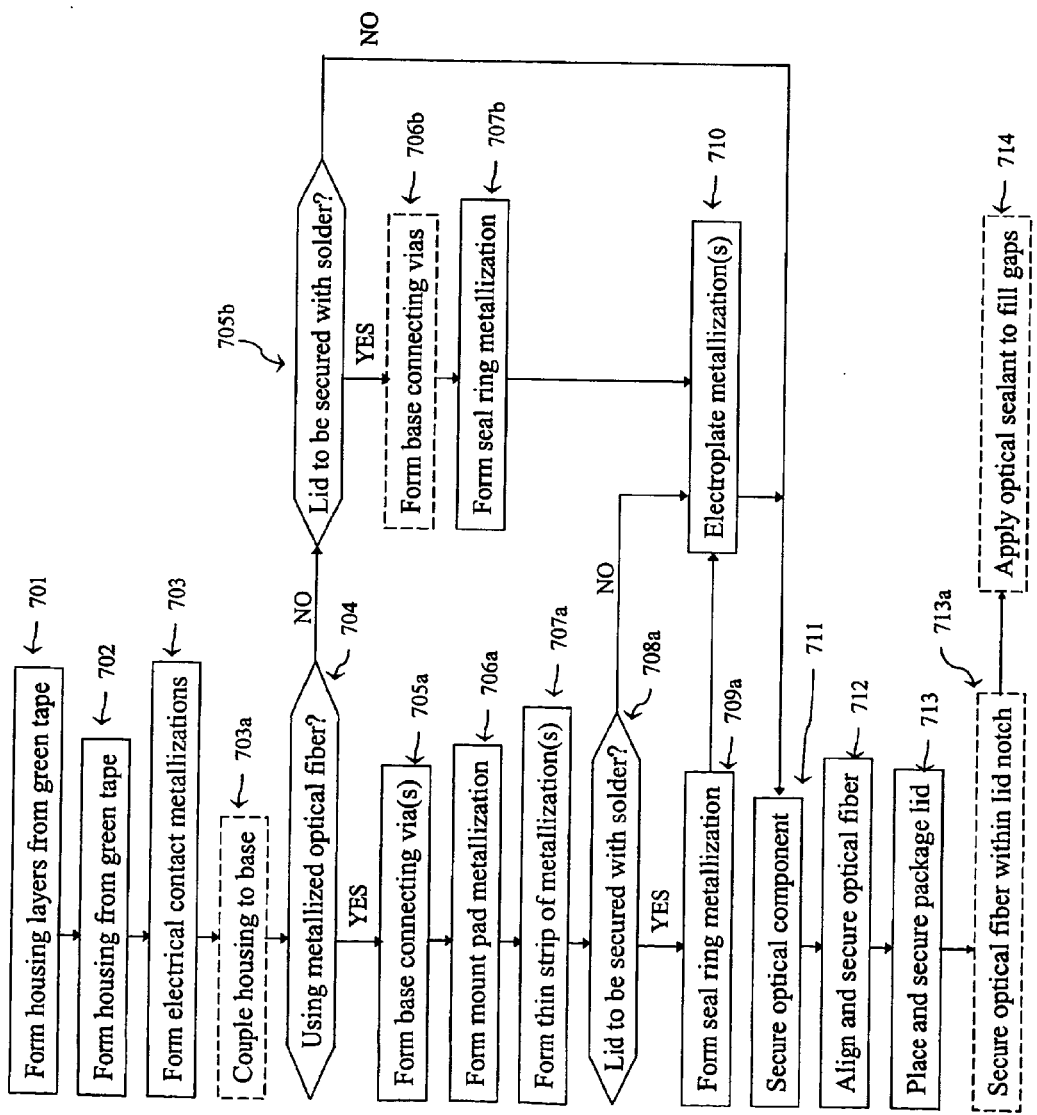
FIG. 7 is a flow chart outlining an exemplary manufacturing procedure according to the present invention.

FIG. 7 is a flow chart showing several exemplary methods of manufacture of an exemplary embodiment of the present invention. The exemplary alternative methods are illustrated using decision blocks in the flow chart. An actual assembly method would use one of the respective paths, without any decision blocks.

In step 701, top and bottom layer apertures are punched through an alumina green tape, whereupon which top and bottom layer substrates are punched from the green tape, each including a respective aperture. Next, in step 702, a fiber-coupled optical component housing including an optical component mountable aperture is formed by coupling the top and bottom layer substrates. It is understood that, in general, the housing may include any number of substrate layers. Electrical contact metallizations for receiving operational power may then be formed on the bottom layer substrate in step 703. In an alternate embodiment, step 703 is performed before step 702. In the exemplary embodiment of the invention, electrical contact metallizations are formed using a tungsten ink. After the contact metallizations are formed on the bottom layer substrate, the top layer substrate and bottom layer substrate may be laminated and fired using, for example, a high-temperature cofired ceramic (HTCC) process, to form the housing. At this point, the housing may be coupled to a high thermal conductivity base in step 703a, for example, by brazing, but this step may generally be postponed until as late as step 710.

At step 704, a decision is made whether the manufacturing process uses metallized optical fiber to be secured to the housing with metal solder, or a bare optical fiber to be secured to the housing with glass solder.

If a metallized fiber is to be used, in step 705a, one or more vias are formed on the housing, going through a top surface of the housing and connecting to the base. A metallic fiber mount pad is formed in step 706a, and one or more thin strips of metallization are formed connecting the mount pad to the one or more base-connecting vias in step 707a. Steps 706a and 707a are generally interchangeable. In step 708a, a decision is made whether the package lid is to be secured using solder. If so, then a metallic seal ring is formed on the surface of the housing in step 709a. If not, manufacturing proceeds to step 710, where all metallizations are electroplated.

If the decision is made to use a bare optical fiber with glass solder at step 704, then in step 705b a decision is made whether or not the package lid is to be secured using solder. If so, then it may be desired in step 706b to form one or more vias on the housing, going through a top surface of the housing and connecting to the base. A metallic seal ring is then formed on the surface of the housing in step 707b. Manufacture then proceeds to step 710, where the seal ring metallization is electroplated. If the decision is made that the package lid is not to be secured using solder at step 705b, then manufacture proceeds to step 711.

At step 711, an optical component 400 (e.g. semiconductor laser) is mounted to the base 200 within the area defined by the housing aperture 311. In step 712, an optical fiber 410 is aligned to receive a desired output signal of the optical component and is then secured at that position using glass solder or metal solder, with a glass solder preform being applied directly over the fiber and onto the ceramic housing and a metal solder preform being applied directly over the metallized fiber and onto the metallic fiber mount pad 313. Once the preform is in place, it is heated to its melting temperature with one or more lasers (not shown) to melt the solder and secure the fiber.

A package lid 540 is then placed over one or more of the housing 210, the optical component 400, and a portion of fiber 410 in step 713. Also, the package lid may be secured using solder or an epoxy. In step 713a, an optional fiber seal 503 may be applied at an opening of the package lid 544 that allows passage of the fiber. This optional seal serves to secure the fiber at the fiber opening and may be, for example, solder or an epoxy. In step 714, an optional optical sealant may be applied at one or more of the package lid, the housing, the fiber, and the base to fill gaps and to further secure the fiber.

It can be seen that the exemplary embodiments of the present invention may be implemented using only vertical assembly processing steps. Further, as seen in FIGS. 3A and 5, access to a side view of housing 210 mounted on base 200 may be provided. This allows monitoring manufacture with cameras, subsequently improving alignment accuracy associated with optically coupling fiber 410 to optical component 400. This may improve manufacturing yield as well as reduce process cycle times. The prior art presented in FIGS. 1A and 1B do not support side view access to cameras. Additionally, optical component 400 and optical fiber 410 are mounted on a shared housing, housing 210, reducing the number of components needed and eliminating the prior art process step which places and attaches a separate fiber mount 5 to the package 1.

As described above, in alternate embodiments of the present invention, it may be desired to secure optical fiber 410 to housing 210 using glass solder and package lid 540 to housing 210 using epoxy, thereby eliminating the need for any metallization on top surface 310 of housing 210 as well as base-connecting vias 306.

FIGS. 8A, 8B, 9A, and 9B show additional embodiments of the present invention, wherein an optical component is coupled directly to the package housing, avoiding the use of an optical component package submount (e.g. 400 in FIG. 5). In both embodiments of FIGS. 8A, 8B, 9A, and 9B, an optical component is mounted directly on a high thermal conductivity base.

Figure 8A:
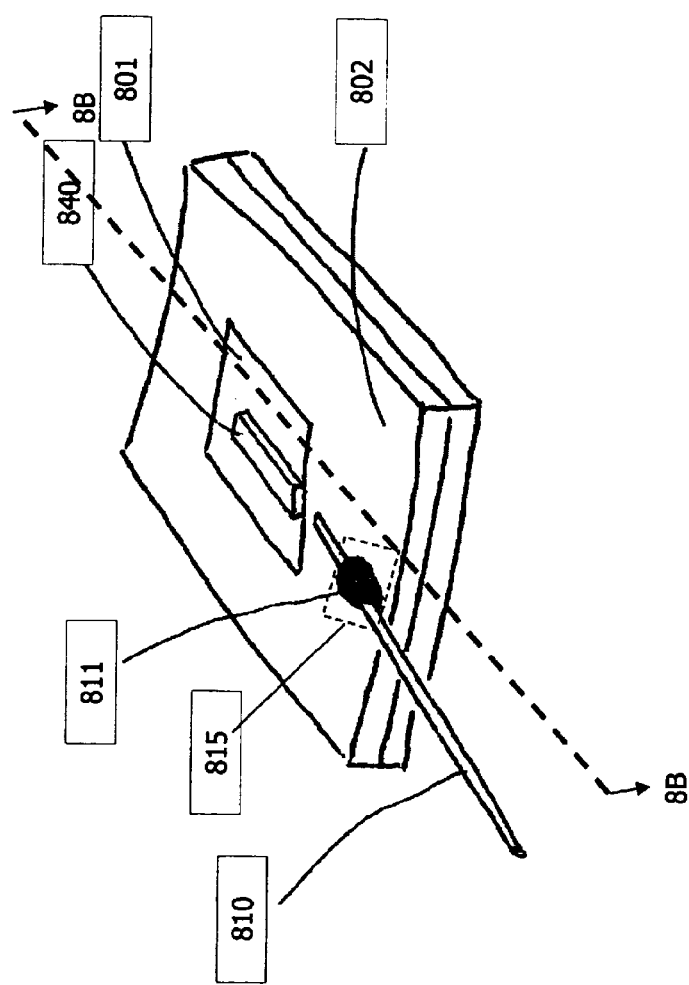
FIG. 8A is a perspective plan drawing of a package according to the present invention.
Figure 8B:
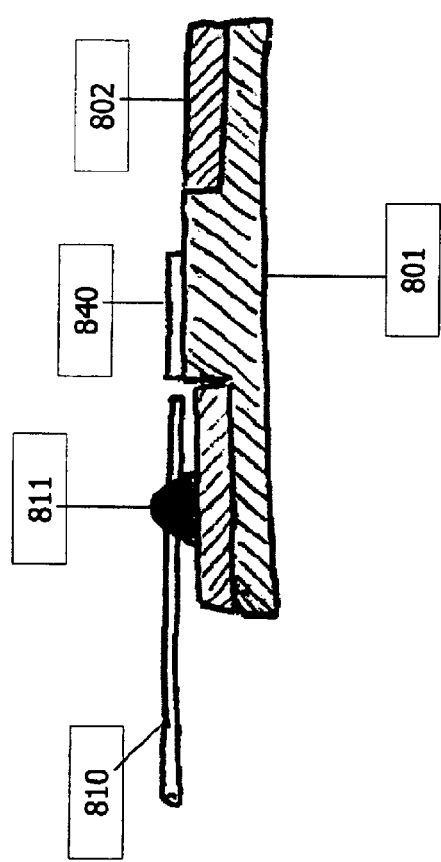
FIG. 8B is a cross-sectional side plan drawing along the cut line 8B—8B of the package in FIG. 8A, according to the present invention.

FIG. 8A shows a perspective view of one such embodiment where optical component 840 is mounted directly to high thermal conductivity base 801. High thermal conductivity base 801 features a mesa portion that extends through an aperture of low thermal conductivity substrate 802 (more clearly seen in the cross-sectional side view of FIG. 8B taken along the cut line 8B—8B, shown in FIG. 8A). Low thermal conductivity substrate 802 may be coupled to the high thermal conductivity base 801 by brazing, for example, with a silver-copper braze. Further, the top surface of the optical component may be metallized desirably to serve as an electrical contact for providing operational power or ground. Additional metallization (not shown in FIG. 8) may be formed on low thermal conductivity base 802 to serve as an electrical contact for providing ground or operational power, respectively. Further metallization (not shown in FIG. 8) may be formed on low thermal conductivity substrate 802 for mounting a lid (not shown in FIG. 8) over the package, and for mounting a metallized optical fiber 810 over fiber mount region 815 with metal solder 811.

Figure 9A:
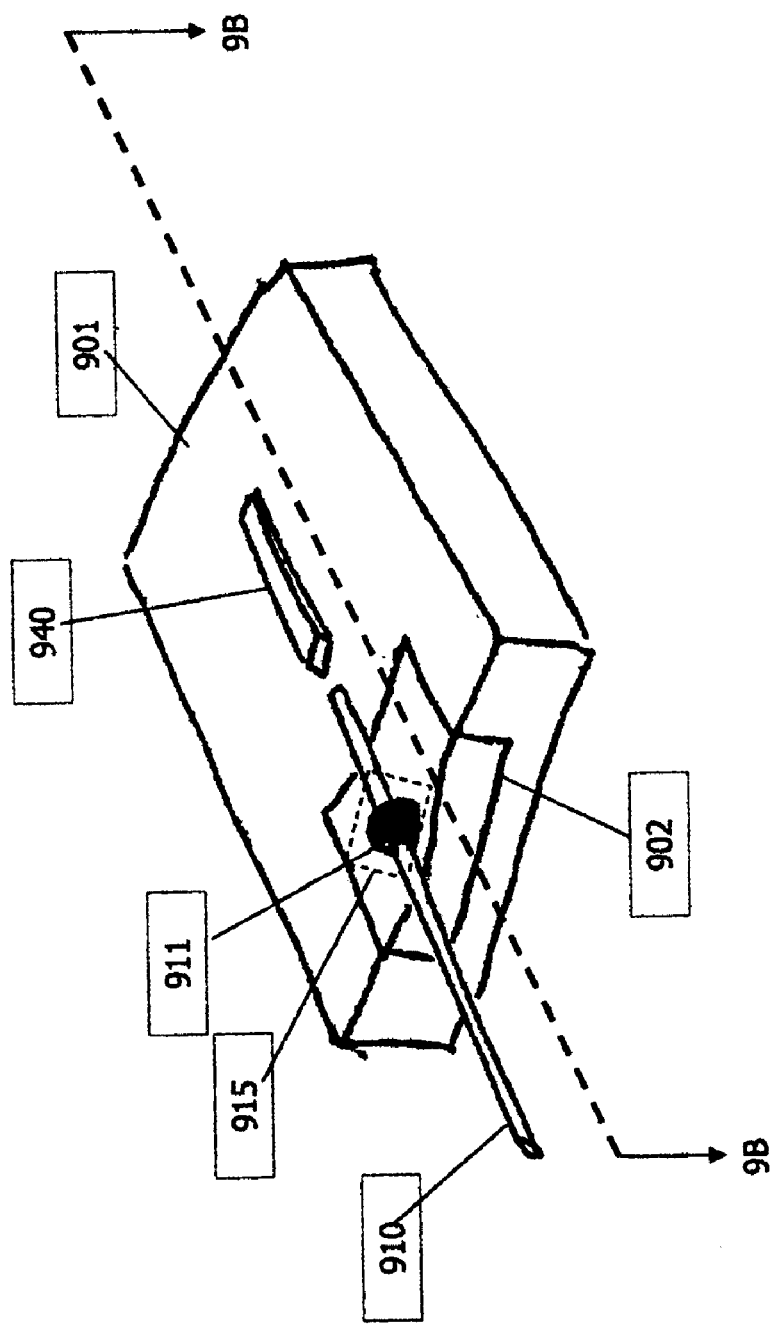
FIG. 9A is a perspective plan drawing of another package according to the present invention.
Figure 9B:
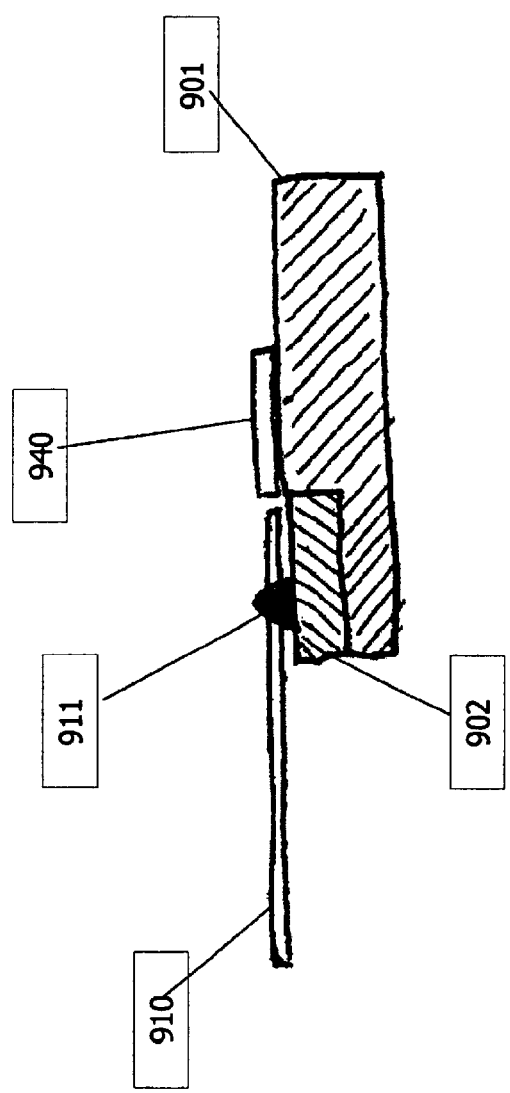
FIG. 9B is a cross-sectional side plan drawing along the cut line 9B—9B of the package in FIG. 9A, according to the present invention.

FIG. 9A shows a perspective view of another such embodiment where optical component 940 is mounted directly to high thermal conductivity base 901. High thermal conductivity base 901 features a cut-out portion that is fitted to accept low thermal conductivity substrate 902 (more clearly seen in the cross-sectional side view of FIG. 9B taken along the cut line 9B—9B, shown in FIG. 9A). Low thermal conductivity substrate 902 may be coupled to high thermal conductivity base 901 by brazing, for example, with a silver-copper braze. Further, the top surface of the optical component may be metallized to desirably serve as an electrical contact for providing operational power or ground. Additional metallization (not shown in FIG. 9) may be formed on low thermal conductivity base 902 over fiber mount region 915 for mounting a metallized optical fiber 910 with metal solder 911.

Typically, submounts are used for laser chip mounting because of yield issues during their initial burn-in. If the laser chip fails burn-in, the submount and laser are discarded, making the cost of the submount a significant contributor to final production costs. Submounts are used, however, since component packages according to the prior art are typically too expensive to allow burn-in of the laser chip directly without the submount. The exemplary embodiments of the present invention may be manufactured much less expensively than the prior art packages, but still not as cheaply as a submount. However, the differential cost between the submount and an exemplary embodiment of the present invention may be offset by the reduction in manufacturing material and assembly steps gained by mounting an optical component directly on the final package assembly during the initial assembly steps.

Figure 10:
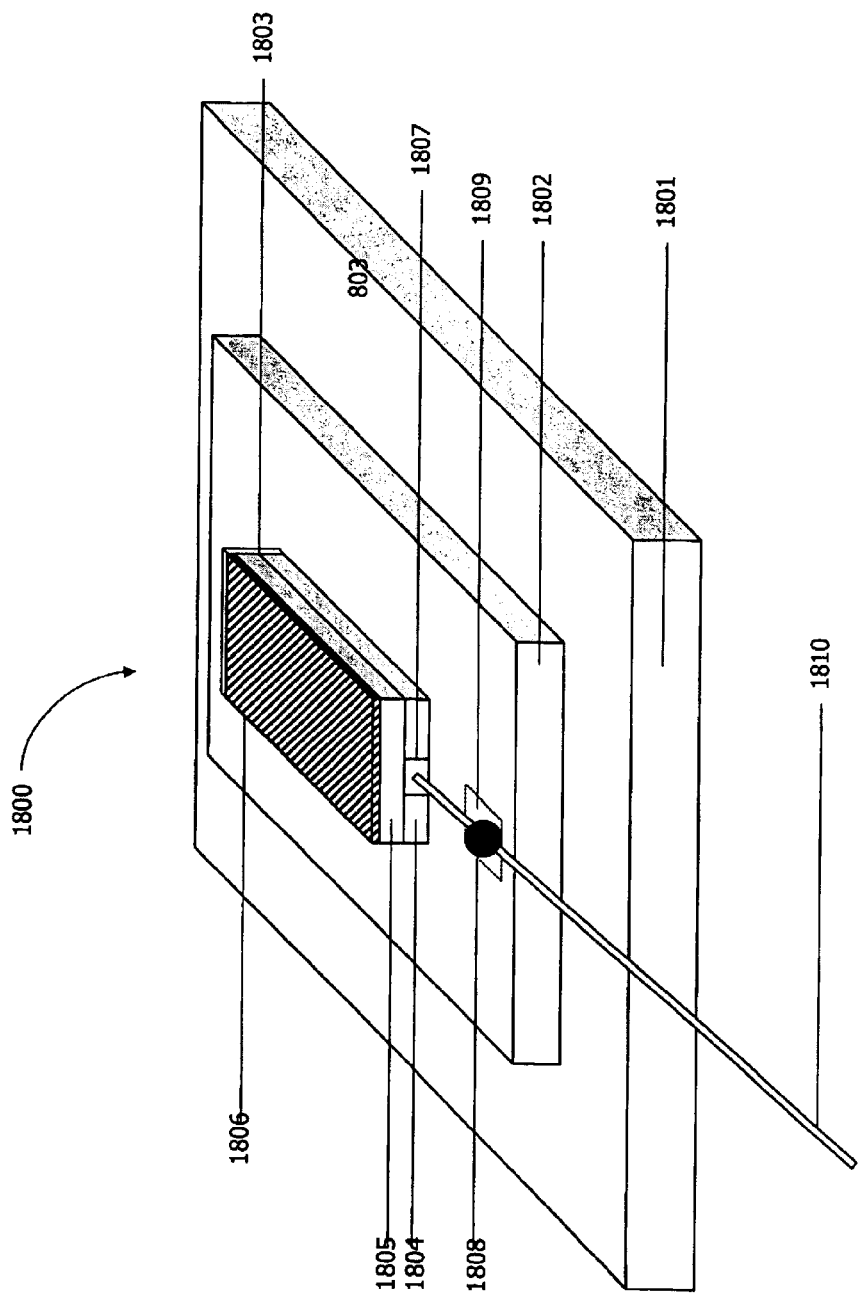
FIG. 10 is a plan drawing of an alternate embodiment of the present invention showing an optical component and fiber mount formed on the same substrate.

FIG. 10 shows an alternative embodiment of the present invention. In this embodiment, an optical fiber 1810 is optically coupled to laser output coupler 1807 of laser 1800. Fiber 1810 is further mechanically coupled to the laser substrate 1802 by solder preform 1808 applied directly over fiber 1810 on fiber mount pad 1809. In an alternate embodiment, fiber 1810 is soldered directly to laser substrate 1802 without fiber mount pad 1809. Laser 1800 includes a substrate 1802 which may include a grating to provide lasing within an active layer 1804 which may be, for example, a bulk gain material or a quantum well structure. Semiconductor layer 1805 is formed over active layer 1804 and is a material with an index of refraction that desirably isolates radiation within the active layer. The front and rear facets of laser 1800 may also be substantially reflective to provide lasing within the active layer. Electrode 1806 is formed on top of the active layer to provide operational power. Laser 1800 is also coupled to high thermal conductivity base 1801, over which a package lid (not shown in FIG. 10) may be secured. In an exemplary embodiment, substrate 1802 may be formed from silicon carbide (SiC) or indium phosphide (InP).

Although illustrated and described above with reference to certain specific embodiments, the present invention is nevertheless not intended to be limited to the details shown. Rather, various modifications may be made in the details within the scope and range of equivalents of the claims and without departing from the invention.

What is claimed is:

1. A fiber-coupled optical component housing comprising a substrate having an optical component mount aperture formed therein and a substantially planar fiber mount region adjacent to the optical component mount aperture, wherein the fiber mount is configured to mount the optical fiber directly to the substrate.

2. A fiber-coupled optical component housing comprising:
   a substrate having an optical component mount aperture formed therein and a substantially planar fiber mount region adjacent to the optical component mount aperture; and
   a metallic fiber mount pad formed on the substantially planar fiber mount region the metallic fiber mount pad being configured to secure the optical fiber to the substrate with a metallic solder.

3. A fiber-coupled optical component housing according to claim 2, further comprising one or more electrical contacts formed on the housing, wherein at least one of the one or more electrical contacts is electrically coupled to the metallic fiber mount pad.

4. A fiber-coupled optical component housing according to claim 2, further comprising means for mounting a lid on the housing.

5. A fiber-coupled optical component housing according to claim 2, wherein the substrate includes at least an aluminum oxide ceramic.

6. A fiber-coupled optical component housing according to claim 2, wherein the housing is mounted on a high thermal conductivity base.

7. A fiber-coupled optical component housing according to claim 6, wherein an optical component is secured to the base within an area defined by the optical component mount aperture.

8. A fiber-coupled optical component housing according to claim 7, wherein an optical fiber is secured on the metallic fiber mount pad using the metallic solder to optically couple the fiber and the optical component.

9. A fiber-coupled optical component package comprising:
   a high thermal conductivity base;
   a fiber-coupled optical component housing joined to a surface of the base and including:
   a substrate having an optical component mount aperture formed therein and a substantially planar fiber mount region adjacent to the optical component mount aperture, wherein the fiber mount region is configured to mount the optical fiber directly to the substrate, and means for mounting a lid on the housing.

10. A fiber-coupled optical component package according to claim 9, further comprising a metallic fiber mount pad formed on the substantially planar fiber mount region.

11. A fiber-coupled optical component package according to claim 9, wherein the means for mounting a lid on the housing comprises a metallized seal ring formed on a surface of the housing.

12. A fiber-coupled optical component package according to claim 9, further comprising an optical component coupled to the base within an area defined by the optical component mount aperture.

13. A fiber-coupled optical component package according to claim 12, further comprising an optical fiber coupled to the substantially planar fiber mount region to optically couple the fiber to an output coupler of the optical component.

14. A fiber-coupled optical component package according to claim 13, further comprising a package lid placed over one or more of the housing, the optical component, and a portion of the fiber.

15. The fiber-coupled optical component package according to claim 14, wherein the lid is secured to the housing by at least one of an epoxy and a solder.

16. The fiber-coupled optical component package according to claim 14, further comprising a fiber sealant applied at gaps between the fiber and one or more of the base, the lid, and the housing.

17. The fiber-coupled optical component package according to claim 16, wherein the fiber sealant is selected from a group consisting of an epoxy, a solder, and a silicone.

18. A method for forming a fiber-coupled optical component package, comprising the steps of:
   a) providing a package base having a high thermal conductivity;
   b) forming a ceramic housing having an optical component mount aperture;
   c) securing the ceramic housing to the base; and
   d) designating a substantially planar fiber mount region on a surface of the ceramic housing adjacent to the optical component mount aperture for mounting an optical fiber directly on the ceramic housing.

19. A method according to claim 18, further comprising the steps of:
   e) securing an optical component to the base within an area defined by the optical component mountable aperture;
   f) coupling an optical fiber to the substantially planar fiber mount region to optically couple the fiber and an output coupler of the optical component.

20. A method according to claim 19, wherein a non-metallized optical fiber is coupled directly to the substantially planar fiber mount region with at least a glass solder.

21. A method for forming a fiber-coupled optical component package, comprising the steps of:
   a) providing a package base having a high thermal conductivity;
   b) forming a ceramic housing having an optical component mount aperture;
   c) securing the ceramic housing to the base;
   d) designating a substantially planar fiber mount region on a surface of the ceramic housing adjacent to the optical component mount aperture;
   e) forming a metallic fiber mount pad on the substantially planar fiber mount region
   f) securing an optical component to the base within an area defined by the optical component mountable aperture;
   g) securing an optical fiber to the metallic fiber mount pad using a metallic solder to optically couple the fiber and an output coupler of the optical component.

22. A method according to claim 21, further comprising the steps of:
   g) placing a package lid over one or more of the housing, the optical component, and a portion of the fiber; and
   h) securing the package lid to at least the housing.

23. The method according to claim 22, wherein the package lid is secured to at least the housing by applying at least one of an epoxy and a solder between the lid and the housing.

24. The method according to claim 22, further comprising the step of:
   g) sealing the fiber by filling gaps between the fiber and one or more of the package base, the package lid, and the package housing.

25. The method according to claim 24, wherein the gaps are filled with at least one of an epoxy, a solder, and a silicone.

* * * * *